(12) United States Patent
Aiso

(10) Patent No.: US 12,385,135 B2
(45) Date of Patent: Aug. 12, 2025

(54) SEMICONDUCTOR MANUFACTURING APPARATUS, METHOD OF MANUFACTURING SEMICONDUCTOR DEVICE AND METHOD OF FILM FORMATION

(71) Applicant: Kioxia Corporation, Tokyo (JP)

(72) Inventor: Fumiki Aiso, Kuwana (JP)

(73) Assignee: Kioxia Corporation, Tokyo (JP)

( * ) Notice: Subject to any disclaimer, the term of this patent is extended or adjusted under 35 U.S.C. 154(b) by 637 days.

(21) Appl. No.: 17/693,660

(22) Filed: Mar. 14, 2022

(65) Prior Publication Data

US 2023/0091037 A1    Mar. 23, 2023

(30) Foreign Application Priority Data

Sep. 21, 2021   (JP) ................. 2021-153476

(51) Int. Cl.
  *C23C 16/455*  (2006.01)
  *H01L 21/02*   (2006.01)
  *H01L 21/285*  (2006.01)

(52) U.S. Cl.
  CPC .. *C23C 16/45544* (2013.01); *C23C 16/45527* (2013.01); *H01L 21/02178* (2013.01); *H01L 21/0228* (2013.01); *H01L 21/28568* (2013.01)

(58) Field of Classification Search
  CPC ........ C23C 16/45527; C23C 16/45544; C23C 16/45561; H01L 21/0228
  See application file for complete search history.

(56) References Cited

U.S. PATENT DOCUMENTS

| | | | | |
|---|---|---|---|---|
| 5,286,331 | A * | 2/1994 | Chen | ........................ C23F 4/00 257/E21.252 |
| 6,225,240 | B1 * | 5/2001 | You | ................... H01L 21/02282 257/E21.243 |
| 10,870,920 | B2 | 12/2020 | Okura | |
| 10,947,621 | B2 | 3/2021 | Khan et al. | |
| 2002/0148135 | A1 * | 10/2002 | Kawase | ........... H01L 21/67109 34/72 |
| 2012/0225203 | A1 | 9/2012 | Yudovsky | |
| 2017/0183773 | A1 * | 6/2017 | Okura | ............... C23C 16/45527 |
| 2017/0198391 | A1 | 7/2017 | Ashihara | |

(Continued)

FOREIGN PATENT DOCUMENTS

| | | |
|---|---|---|
| CN | 106960806 A | 7/2017 |
| JP | 2007227501 A * | 9/2007 |

(Continued)

*Primary Examiner* — Joshua Benitez Rosario
*Assistant Examiner* — Jacob T Nelson
(74) *Attorney, Agent, or Firm* — Oblon, McClelland, Maier & Neustadt, L.L.P.

(57) ABSTRACT

A semiconductor manufacturing apparatus according to the present embodiment includes a chamber on which a substrate is placed, a first gas flow path configured to supply a first processing gas into the chamber, a second gas flow path configured to supply a second processing gas into the chamber, a first replacement gas flow path configured to supply a first replacement gas into the chamber, a replacement gas heating unit configured to heat the first replacement gas, a second replacement gas flow path configured to supply a second replacement gas into the chamber, and a replacement gas cooling unit configured to cool the second replacement gas.

10 Claims, 6 Drawing Sheets

(56) References Cited

U.S. PATENT DOCUMENTS

2018/0119280 A1* 5/2018 Daigo ............... C23C 16/45565
2019/0249302 A1    8/2019 Pudas
2020/0071831 A1* 3/2020 Kuwada ............. H01L 21/0228
2020/0234933 A1* 7/2020 Iino ................... H01J 37/32449

FOREIGN PATENT DOCUMENTS

| JP | 2014-513203 A | 5/2014 |
| JP | 2016-023324 A | 2/2016 |
| JP | 2016-084526 A | 5/2016 |
| JP | 2019-530798 A | 10/2019 |
| JP | 2020-077751 A | 5/2020 |
| JP | 2021-500471 A | 1/2021 |
| TW | 201335404 A1 | 9/2013 |

* cited by examiner

SEMICONDUCTOR MANUFACTURING APPARATUS, METHOD OF MANUFACTURING SEMICONDUCTOR DEVICE AND METHOD OF FILM FORMATION

CROSS REFERENCE TO RELATED APPLICATION(S)

This application is based upon and claims the benefit of priority from the prior Japanese Patent Application JP2021-153476, filed on Sep. 21, 2021, the entire contents of which are incorporated herein by reference.

FIELD

Embodiment described herein relate generally to a semiconductor manufacturing apparatus, a method of manufacturing a semiconductor device, and a method of film formation.

BACKGROUND

An ALD (Atomic Layer Deposition) method in which a raw material gas (precursor) and a reaction gas (reactant) which reacts with the raw material gas are alternately supplied to a semiconductor substrate to deposit a layer of a reaction product on a surface of the substrate to obtain a thin film is known as a method of forming a film on a semiconductor substrate. The precursor and the reactant are independently introduced (pulsed) and discharged (purged). In each pulse, precursor molecules and reactor molecules react with a reaction site on the semiconductor substrate surface in a self-controlled manner, respectively. A film of one layer of reaction product can be formed on the semiconductor substrate surface by reacting the reaction site on the semiconductor substrate surface during the pulse and completely desorbing unreacted precursor molecules or unreacted reactor molecules during the purge. Repeating the pulse and purge of the precursor and the pulse and purge of the reactant as one cycle enables a strict control of the film thickness. An ALE (Atomic Layer Etching) method is known as a technique for etching the semiconductor substrate using the same principles.

DETAILED DESCRIPTION

Hereinafter, a semiconductor manufacturing apparatus and a method of manufacturing a semiconductor device according to the present embodiment will be described in detail with reference to the drawings. In the following description, elements having substantially the same functions and configurations are denoted by the same symbols or with the same symbols followed by an addition of a letter and will be described in duplicate only when necessary. Each embodiment described below exemplifies an apparatus and a method for embodying a technical idea of this embodiment. Various changes may be made in the embodiment without departing from the gist of the disclosure. These embodiments and modifications thereof are included within the scope of disclosures described in claims and their equivalents.

For the sake of clarity of description, although the drawings may be schematically represented with respect to widths, thicknesses, shapes, and the like of the respective parts compared with actual embodiments, they are merely examples and do not limit the interpretation of the present disclosure. In this specification and each drawing, elements having the same functions as those described with reference to the preceding drawings are denoted by the same symbols, and a repetitive description thereof may be omitted.

In this specification, the expression "a includes A, B, or C" does not exclude the case where a includes multiple combinations of A to C unless otherwise specified. Furthermore, these expressions do not exclude the case where a includes other elements.

In this specification, horizontal may refer to horizontal direction (XY direction) with respect to a stage of a semiconductor manufacturing apparatus, and vertical may refer to direction (Z direction) substantially perpendicular to the horizontal direction.

The following embodiments may be combined with each other as long as there is no technical contradiction.

In the following embodiments, although a memory cell array is exemplified as a semiconductor device, the disclosed techniques can be applied to a semiconductor device other than memory cell array (e.g., a CPU, a display, an interposer, etc.).

A semiconductor manufacturing apparatus according to an embodiment includes a chamber on which a substrate is placed, a first gas flow path configured to supply a first processing gas into the chamber, a second gas flow path configured to supply a second processing gas into the chamber, a first replacement gas flow path configured to supply a first replacement gas into the chamber, a replacement gas heating unit configured to heat the first replacement gas, a second replacement gas flow path configured to supply a second replacement gas into the chamber, and a replacement gas cooling unit configured to cool the second replacement gas.

<Semiconductor Manufacturing Apparatus>

Figure 1:
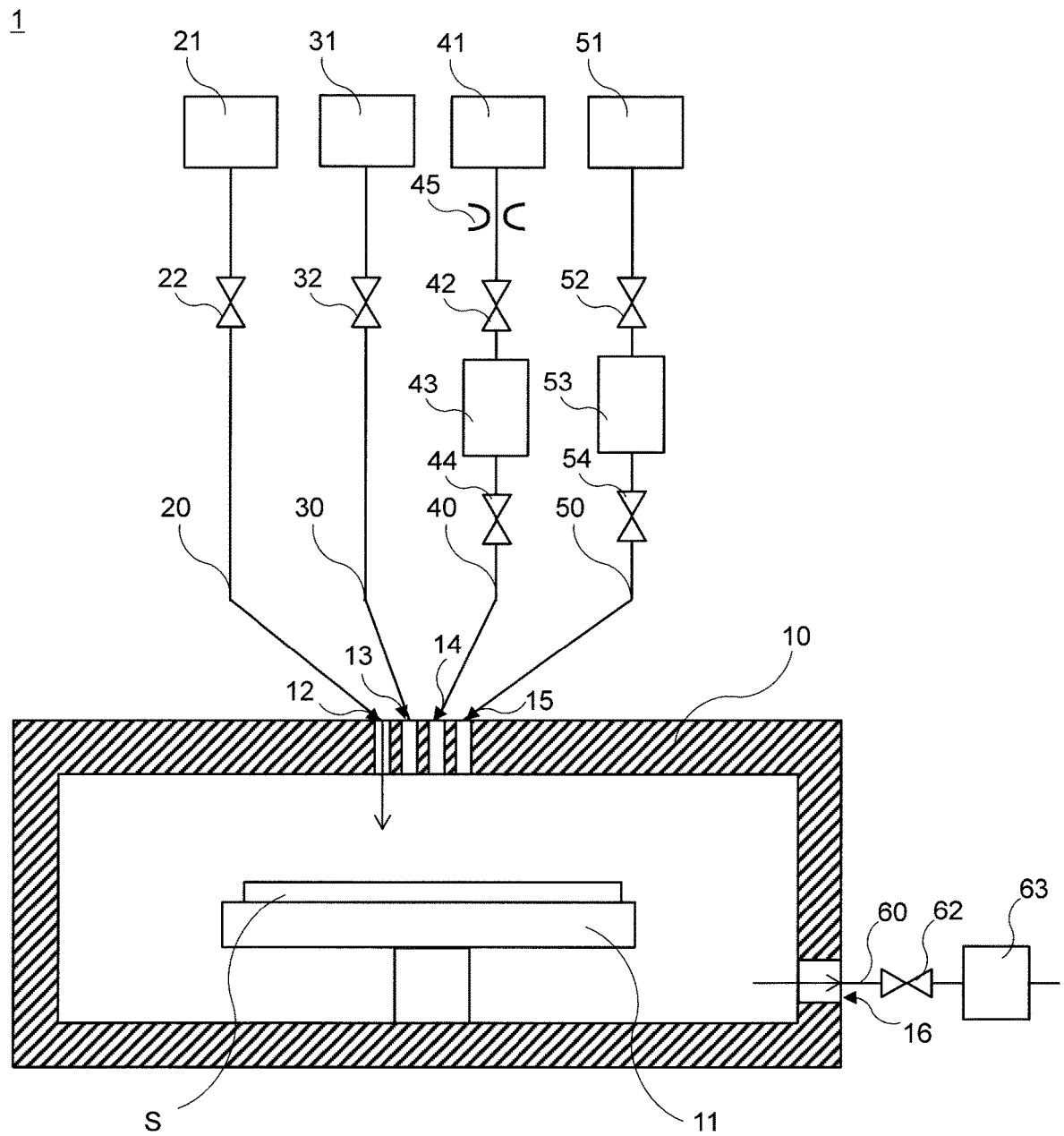
FIG. 1 is a diagram schematically showing an entire configuration of a semiconductor manufacturing apparatus according to an embodiment.

FIG. 1 is a diagram schematically showing an entire configuration of a semiconductor manufacturing apparatus according to an embodiment. A semiconductor manufacturing apparatus 1 according to the present embodiment is, for example, a single wafer type ALD/ALE apparatus configured to perform film formation or etching with respect to one semiconductor substrate, it can also be referred to as a film forming apparatus. As shown in FIG. 1, the semiconductor manufacturing apparatus 1 includes a chamber 10 and four gas supply paths 20, 30, 40, and 50.

The chamber 10 includes a stage 11 for fixing a substrate S. The stage 11 can be placed such that a main surface of the wafer-shaped (disk-shaped) substrate S is in the horizontal direction. Four gas supply ports 12, 13, 14, and 15 penetrating the chamber 10 are arranged above the stage 11. The four gas supply paths 20, 30, 40, and 50 are connected to the four gas supply ports 12, 13, 14, and 15, respectively. The respective gases supplied from the four gas supply paths 20, 30, 40, and 50 are dispersed in the chamber 10 and uniformly supplied to the substrate S on the stage 11. A gas exhaust port 16 penetrating the chamber 10 is arranged below the stage 11. A gas exhaust path 60 is connected to the gas exhaust port 16. The gas in the chamber 10 is exhausted from the gas exhaust path 60. A temperature control mechanism (not shown) is provided in the chamber 10, and the temperature of the entire chamber 10 is controlled.

A gas supply apparatus 21 configured to supply a raw material gas is connected to the gas supply path 20 (first gas flow path). The gas supply apparatus 21 supplies the raw material gas to the gas supply path 20 while adjusting the flow rate and pressure. A valve 22 is arranged between the gas supply apparatus 21 and the gas supply port 12. When the valve 22 is opened, the raw material gas is supplied into the chamber 10 from the gas supply port 12 via the gas supply path 20.

A gas supply apparatus 31 configured to supply a reaction gas is connected to the second gas supply path 30 (second gas flow path). The gas supply apparatus 31 supplies the reaction gas to the gas supply path 30 while adjusting the flow rate and pressure. A valve 32 is arranged between the gas supply apparatus 31 and the gas supply port 13. When the valve 32 is opened, the reaction gas is supplied into the chamber 10 from the gas supply port 13 via the gas supply path 30.

Figure 2:
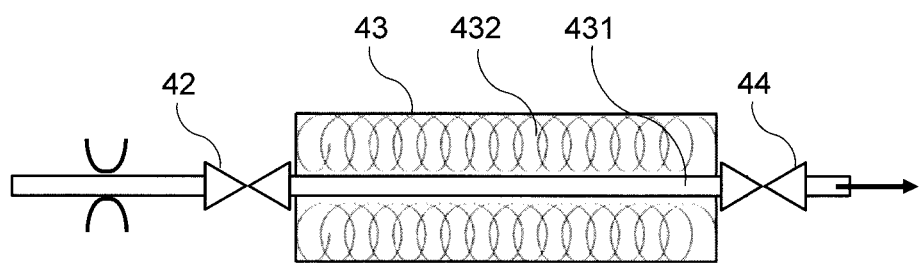
FIG. 2 is a cross-sectional view schematically showing a structure of a heating mechanism.

A gas supply apparatus 41 configured to supply a replacement gas is connected to the gas supply path 40 (first replacement gas flow path). The replacement gas may also be referred to as a purge gas. The gas supply apparatus 41 supplies the replacement gas to the gas supply path 40 while adjusting the flow rate and pressure. A pressure control mechanism 45, a valve 42, a heating mechanism (replacement gas heating unit) 43, and a valve 44 are arranged in this order between the gas supply apparatus 41 and the gas supply port 14. The replacement gas supplied from the gas supply apparatus 41 is depressurized by the pressure control mechanism 45. The pressure control mechanism 45 may be, for example, an orifice. When the valve 42 is opened, the depressurized replacement gas is supplied to the heating mechanism 43. FIG. 2 is a cross-sectional view schematically showing a structure of the heating mechanism 43. The heating mechanism 43 has a gas flow path 431 and the heater 432. The heater 432 is arranged so as to surround the gas flow path 431. The replacement gas supplied to the gas flow path 431 of the heating mechanism 43 can be heated by the heater 432. The heating mechanism 43 heats, for example, the temperature of the replacement gas to a temperature higher than the temperatures of the raw material gas or the temperatures of the reaction gas. When the valve 44 is opened, the heated replacement gas is supplied into the chamber 10 from the gas supply port 14 via the gas supply path 40.

Figure 3:
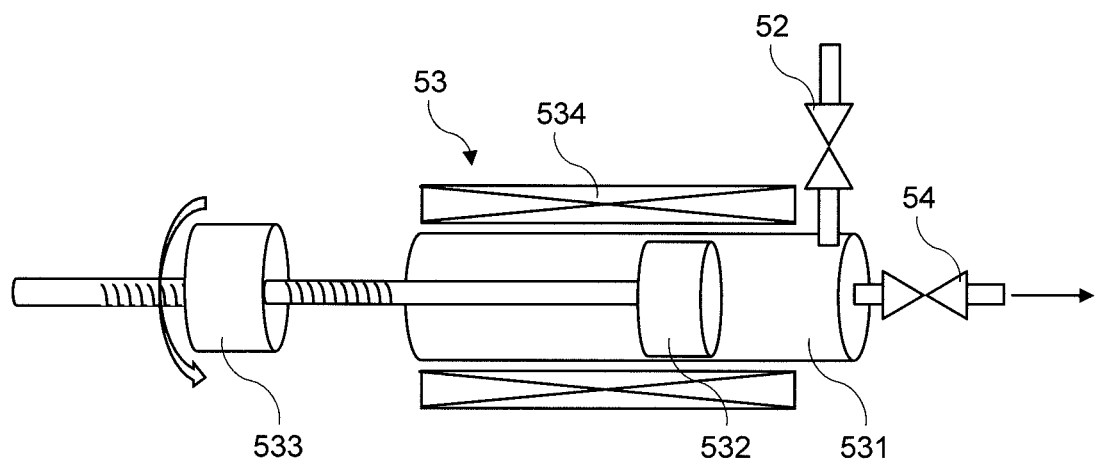
FIG. 3 is a cross-sectional view schematically showing a structure of a cooling mechanism.

A gas supply apparatus 51 configured to supply the replacement gas is connected to the gas flow path (second replacement gas flow path) 50. The gas supply apparatus 51 supplies the replacement gas to the gas supply path 50 while adjusting the flow rate and pressure. A valve 52, a cooling mechanism (replacement gas cooling unit) 53, and a valve 54 are arranged in this order between the gas supply apparatus 51 and the gas supply port 15. When the valve 52 is opened, the replacement gas is supplied to the cooling mechanism 53. FIG. 3 is a cross-sectional view schematically showing a structure of the cooling mechanism 53. The cooling mechanism 53 is a pump configured to expand and cool the gas by rapidly changing a volume of a space, and includes a syringe 531, a piston 532, a movable part 533, and a heat insulating material 534. The piston 532 is arranged in slidable on an inner surface of the syringe 531. The movable part 533 is screwed onto the shaft of the piston 532. The piston 532 slides with respect to the syringe 531 by the rotation (arrow) of the movable part 533. The heat insulating material 534 is arranged so as to surround the syringe 531.

The replacement gas supplied to the cooling mechanism 53 is supplied to a space surrounded by the syringe 531 and the piston 532. A volume of the space surrounded by the syringe 531 and the piston 532 can be changed by sliding the piston 532 by the movable part 533. By closing the valves 52 and 54 and rapidly adiabatically expanding the space surrounded by the syringe 531 and the piston 532, it is possible to cool the temperature of the gas in the space. For example, by rapidly double adiabatically expanding the volume of the gas from a gauge pressure of 0.6 MPa to 0.3 MPa (atmospheric pressure from 7 atm to 3 atm), the temperature of the gas is cooled by about 50° C. The cooling mechanism 53 cools, for example, the temperature of the replacement gas to a temperature lower than the temperatures of the raw material gas or the temperatures of the reaction gas. When the valve 54 is opened, the cooled replacement gas is supplied into the chamber 10 from the gas supply port 15 via the gas supply path 50.

In the present embodiment, the cooling mechanism 53 is shown as a pump configured to expand and cool the gas by the syringe 531 and the piston 532. However, it is not limited to this, the cooling mechanism 53 may be a bellows or diaphragm as long as it can rapidly change the volume of the space.

A valve 62 and an exhaust pump 63 are arranged in this order in the gas exhaust path 60. When the valve 62 is opened, the exhaust pump 63 exhausts the gas in the chamber 10 from the gas exhaust port 16 via the gas exhaust path 60.

<Method of Manufacturing Semiconductor Device>

Figure 4:
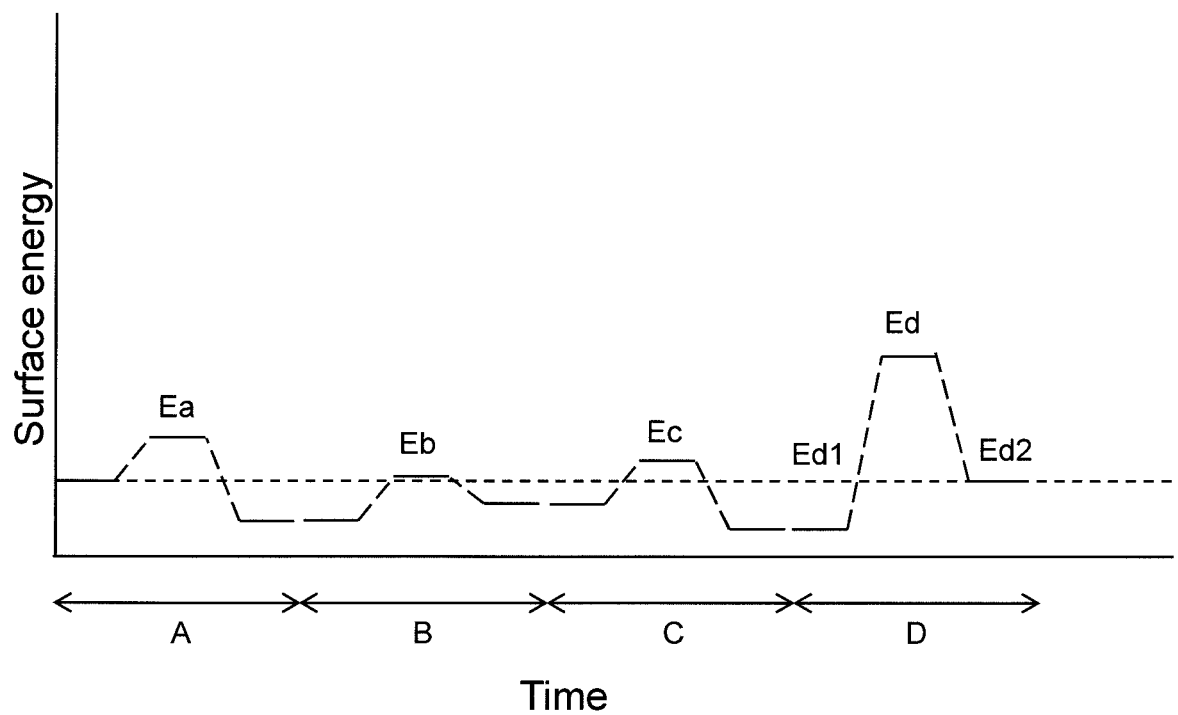
FIG. 4 is a diagram showing changes in surface energy of a substrate in a method of manufacturing a semiconductor device according to an embodiment.
Figure 5:
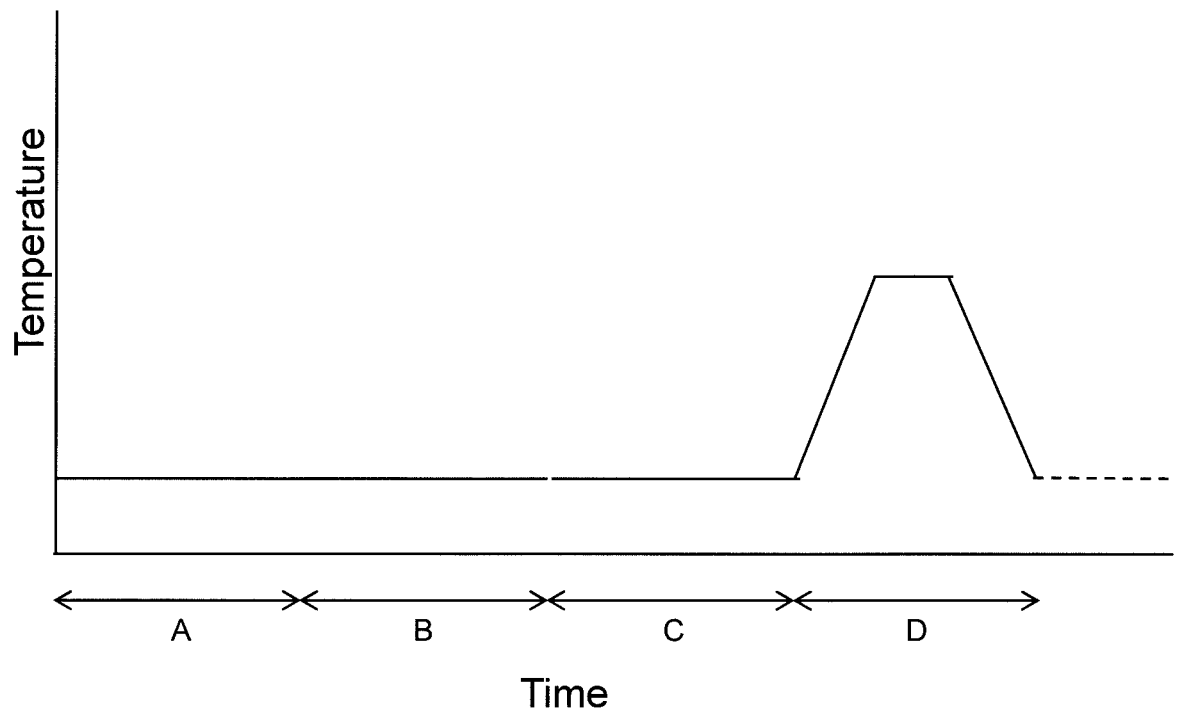
FIG. 5 is a diagram showing temperature changes of a wafer surface in a method of manufacturing a semiconductor device according to an embodiment.

Hereinafter, a method of manufacturing a semiconductor device using the semiconductor manufacturing apparatus 1 according to the present embodiment will be described. A method of manufacturing the semiconductor device of the embodiment includes a step of forming a desired film above the semiconductor substrate using, for example, an ALD method or an ALE method. The ALD method or the ALE method involves four steps: A. adsorption of the raw material gas, B. desorption of the raw material gas, C. adsorption of the reaction gas, and D. desorption of the reaction gas. FIG. 4 shows changes in an energy of a surface reaction of the substrate in the method of manufacturing the semiconductor device according to an embodiment. FIG. 4 shows surface energies before and after the reaction and activation energies of the respective elementary processes in the four steps of A. adsorption of the raw material gas, B. desorption of the raw material gas, C. adsorption of the reaction gas, and D. desorption of the reaction gas. In each elementary process, the surface energy of the substrate is different. During the cycle sequence of four steps, there is a step in which the activation energy is high, and the energy after the reaction is higher than the energy before the reaction, that is, the so-called reverse reaction is easier to proceed. For example, in FIG. 4, in the step of D. desorption of the reaction gas, an activation energy Ed is higher than activation energies Ea, Eb, and Ec of the other steps, and an energy Ed2 after the reaction is higher than an energy Ed1 before the reaction. In a semiconductor substrate for manufacturing a three-dimensional NAND flash memory having a complicated structure, a step having such a high activation energy and a higher surface energy after the reaction than before the reaction will be a rate-limiting process. If the desorption of the reaction gas is incomplete, the remaining molecules may react with the next molecules to form a by-product, which makes it difficult to control the film formation or etching. For this reason, in the method of manufacturing the semiconductor device using the semiconductor manufacturing apparatus 1 according to the present embodiment, the manufacturing efficiency is improved by temporarily raising the temperature of the supply gas and returning it to the original temperature in the step that becomes the rate-limiting process. FIG. 5 shows an example of temperature changes of a wafer surface in the method of manufacturing the semiconductor device according to an embodiment. The temperature of the entire chamber 10 during the cycle sequence is appropriately controlled by the temperature control mechanism (not shown).

First, the substrate S is placed on the stage 11 of the chamber 10. The substrate S is, for example, a semiconductor substrate for manufacturing a three-dimensional NAND flash memory with many memory cells stacked.

A. In order to adsorb the raw material gas, the valve 22 of the gas supply path 20 is opened to supply the raw material gas to the chamber 10. In this case, the valves 32, 42, and 52 of the gas supply path 30, 40, and 50 are closed. The raw material gas is, for example, a gas having an element contained in the formed film.

B. In order to desorb the raw material gas, the valves 52 and 54 of the gas supply path 50 are opened to supply the replacement gas to the chamber 10, and the valve 62 of the gas exhaust path 60 is opened to exhaust the gas in the chamber 10. In this case, the cooling mechanism 53 does not function by opening both the valves 52 and 54, and the replacement gas is not cooled. The valves 22, 32, and 52 of the gas supply paths 20, 30, and 50 are closed. The replacement gas may be, for example, nitrogen ($N_2$) or argon (Ar).

C. In order to react and adsorb the reaction gas with the raw material gas adsorbed on the substrate, the valve 32 of the gas supply path 30 is opened to supply the reaction gas to the chamber 10. In this case, the valves 22, 42, and 52 of the gas supply path 20, 40, and 50 are closed. The reaction gas is, for example, a gas containing hydrogen (H), and may also be referred to as a reducing gas.

D. In order to desorb the reaction gas, the valve 42 of the gas supply path 40 is opened to supply the replacement gas to the heating mechanism 43, and the replacement gas is heated. The valve 44 of the gas supply path 40 is opened to supply the heated replacement gas to the chamber 10. The temperature of the heated replacement gas may be higher than the temperatures of the raw material gas or the temperatures of the reaction gas. The valve 62 of the gas exhaust path 60 is opened to exhaust the gas in the chamber 10. In this case, the valves 22, 32, and 52 of the gas supply paths 20, 30, and 50 are closed.

In the method of manufacturing the semiconductor device according to the present embodiment, the desorption of the reaction gas on the substrate can be promoted by temporarily raising the temperature of the replacement gas. This reduces the time of the step that becomes the rate-limiting process in the cycle sequence, and it is possible to improve the manufacturing efficiency of the semiconductor device. In addition, the generation of a by-product due to the remaining gas can be suppressed, and it is possible to improve the reliability of the semiconductor device.

Before entering the next cycle, the valve 52 of the gas supply path 50 is opened to supply the replacement gas to the cooling mechanism 53. By closing the valves 52 and 54 and rapidly adiabatically expanding the space surrounded by the syringe 531 and the piston 532, it is possible to cool the temperature of the replacement gas. The valve 54 of the gas supply path 50 is opened to supply the cooled replacement gas to the chamber 10. The temperature of the cooled replacement gas may be lower than the temperatures of the raw material gas or the temperatures of the reaction gas. Further, the valve 62 of the gas exhaust path 60 is opened to exhaust the gas in the chamber 10. In this case, the valves 22, 32, and 42 of the gas supply paths 20, 30, and 40 are closed. The replacement gas may be, for example, nitrogen ($N_2$) or argon (Ar).

In the method of manufacturing the semiconductor device according to the present embodiment, by returning (lowering) the temperature of the replacement gas, it can be optimized for the reaction temperature of the next cycle. This makes it possible to reduce the time of the step during the cycle sequence, and it is possible to improve the manufacturing efficiency of the semiconductor device.

In the method of manufacturing the semiconductor device using the semiconductor manufacturing apparatus 1 according to the present embodiment, the step that becomes the rate-limiting process can be promoted by temporarily raising the temperature of the supply gas and returning it to the original temperature. This reduces the time of the step that becomes the rate-limiting process in the cycle sequence, and it is possible to improve the manufacturing efficiency of the semiconductor device. In addition, the generation of a by-product due to the remaining gas can be suppressed, and it is possible to improve the reliability of the semiconductor device.

The ALD process in the method for manufacturing a semiconductor device of the embodiment may be applied to, for example, barrier metal layer (TiN, TaN) formation of a word line forming step of a three-dimensional NAND device. Alternatively, it may be applied to the formation of the block insulating film ($Al_2O_3$), but is not particularly limited. The ALE process in the method for manufacturing a semiconductor device of the embodiment may be applied to, for example, a slimming step of a layer containing silicon, for example of a discrete semiconductor device, but is not particularly limited. The semiconductor manufacturing apparatus 1 of the embodiment is not limited to the manufacturing of the semiconductor device, and may be used for the ALD, ALE process in a substrate such as a quartz substrate.

Modifications

A configuration of the semiconductor manufacturing apparatus according to the present modification is the same as that the configuration of the semiconductor manufacturing apparatus according to an embodiment, except that it is a batch-type for simultaneously processing many substrates. The method of manufacturing the semiconductor device according to the present modification is the same as the method of manufacturing the semiconductor device according to an embodiment. Descriptions that are the same as those in the embodiment are omitted, and portions different from the configuration of the semiconductor manufacturing apparatus according to the embodiment will be described.

<Semiconductor Manufacturing Apparatus>

Figure 6:
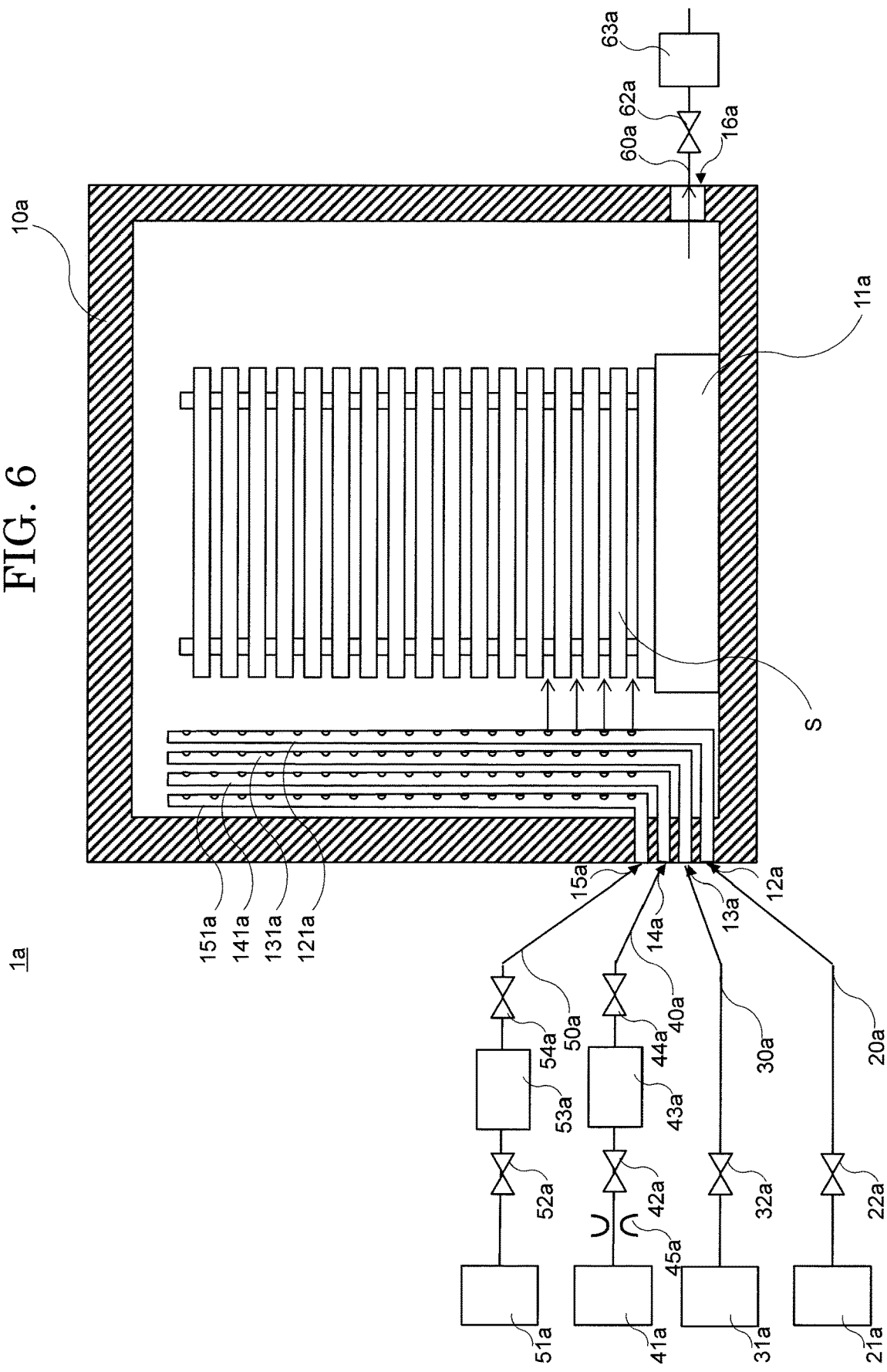
FIG. 6 is a diagram schematically showing an entire configuration of a semiconductor manufacturing apparatus according to a modification.

FIG. 6 is a diagram schematically showing an entire configuration of the semiconductor manufacturing apparatus according to a modification. A semiconductor manufacturing apparatus 1a according to the present modification is, for example, a batch-type ALD/ALE apparatus configured to perform film formation or etching with respect to a plurality of semiconductor substrates. As shown in FIG. 6, the semiconductor manufacturing apparatus 1a includes a chamber 10a, and four gas supply paths 20a, 30a, 40a, and 50a.

The chamber 10a includes a stage 11a for fixing the substrates S. The stage 11a can be placed side by side in a row such that main surfaces of a plurality of substrates S are in the horizontal direction at a predetermined interval. The substrates S may be capable of accommodating, for example, up to 200 in one chamber 10a. Four gas supply ports 12a, 13a, 14a, and 15a penetrating the chamber 10a are arranged at a side of the stage 11a. The four gas supply paths 20a, 30a, 40a, and 50a are connected to the four gas supply ports 12a, 13a, 14a, and 15a, respectively. Each gas supplied from the four gas supply paths 20a, 30a, 40a, and 50a is supplied into the chamber 10 from gas supply pipes 121a, 131a, 141a, and 151a via the four gas supply ports 12a, 13a, 14a, and 15a. The gas supply pipes 121a, 131a, 141a, and 151a extend in the direction in which the plurality of substrates S is arranged in a row (vertical direction).

The gas supply pipes 121a, 131a, 141a, and 151a have a plurality of gas discharge ports on a side in the direction in which the plurality of substrates S is arranged in a row (vertical direction). The gas discharge port is preferably arranged between the plurality of substrates S. The gas discharged from the gas discharge port is uniformly supplied to the plurality of substrates S. A gas exhaust port 16a penetrating the chamber 10a is arranged below the stage 11a. A gas exhaust path 60a is connected to the gas exhaust port 16a. The gas in the chamber 10a is exhausted from the gas exhaust path 60a. The temperature control mechanism (not shown) is provided in the chamber 10a, and the temperature of the entire chamber 10a is controlled. Alternatively, the gas supply pipes 121a, 131a, 141a, and 151a do not have a plurality of discharge ports on the side and may have discharge ports at the ends of the gas supply pipes 121a, 131a, 141a, and 151a. In FIG. 6, although heights of the ends of the gas supply pipes 121a, 131a, 141a, and 151a are shown to be near upper steps of the plurality of substrates S, the heights of the gas supply pipes are not particularly limited.

Since the configurations of the four gas supply paths 20a, 30a, 40a, and 50a and the method of manufacturing the semiconductor device are the same as those of the method of manufacturing the semiconductor device according to an embodiment, the description thereof is omitted here.

The method of manufacturing the semiconductor device using the semiconductor manufacturing apparatus 1a according to the present modification, the step that becomes the rate-limiting process can be promoted by temporarily raising the temperature of the supply gas and returning it to the original temperature. This reduces the time of the step that becomes the rate-limiting process in the cycle sequence, and it is possible to improve the manufacturing efficiency of the semiconductor device. In addition, the generation of a by-product due to the remaining gas can be suppressed, and it is possible to improve the reliability of the semiconductor device.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor manufacturing apparatus comprising:
a chamber on which a substrate is placed;
a first gas flow path configured to supply a first processing gas into the chamber;
a second gas flow path configured to supply a second processing gas into the chamber;
a first replacement gas flow path configured to supply a first replacement gas into the chamber;
a replacement gas heating unit configured to heat the first replacement gas;
a second replacement gas flow path configured to supply a second replacement gas into the chamber; and
a replacement gas cooling unit configured to cool the second replacement gas, the replacement gas cooling unit including a pump configured to rapidly adiabatically expand a volume of the second replacement gas, the pump including:
a syringe,
a piston slidably arranged on an inner surface of the syringe,
a movable part screwed onto a shaft of the piston, and
a heat insulating material arranged so as to surround the syringe,
wherein the piston slides with respect to the syringe by a rotation of the movable part.

2. The semiconductor manufacturing apparatus according to claim 1, wherein the replacement gas cooling unit cools the second replacement gas to a temperature lower than a temperature of the first processing gas and a temperature of the second processing gas.

3. The semiconductor manufacturing apparatus according to claim 1, wherein the replacement gas heating unit heats the first replacement gas to a temperature higher than a temperature of the first processing gas and a temperature of the second processing gas.

4. The semiconductor manufacturing apparatus according to claim 1, wherein the pump expands the second replacement gas to a volume double that of the volume of the second replacement gas.

5. The semiconductor manufacturing apparatus according to claim 1, wherein the replacement gas cooling unit further includes a heat insulating material.

6. A method of manufacturing semiconductor device comprising:
a step of supplying a first processing gas into a chamber in which a substrate is placed;
a step of supplying a first volume of a second replacement gas at a first temperature into the chamber;
a step of supplying a second processing gas into the chamber;
a step of supplying a first replacement gas having a temperature higher than the first temperature, a temperature of the first processing gas, and a temperature of the second processing gas into the chamber; and
a step of supplying a second volume of the second replacement gas having a temperature lower than the first temperature, the temperature of the first processing gas, and the temperature of the second processing gas into the chamber, and
repeating each of the steps.

7. The method of manufacturing semiconductor device according to claim 6, wherein a replacement gas cooling unit is configured to cool the second volume of the second replacement gas, the replacement gas cooling unit including a pump configured to rapidly adiabatically expand a volume of the second replacement gas, the pump including:
- a syringe,
- a piston slidably arranged on an inner surface of the syringe,
- a movable part screwed onto a shaft of the piston, and
- a heat insulating material arranged so as to surround the syringe,
- wherein the piston slides with respect to the syringe by a rotation of the movable part.

8. The method of manufacturing semiconductor device according to claim 7, wherein the pump expands the second replacement gas to a volume double that of the volume of the second replacement gas.

9. The method of manufacturing semiconductor device according to claim 6, wherein the second replacement gas contains an inert gas.

10. A method of film formation comprising:

a step of supplying a first processing gas into a chamber in which a substrate is placed;

a step of supplying a first volume of a second replacement gas at a first temperature into the chamber;

a step of supplying a second processing gas into the chamber;

a step of supplying a first replacement gas having a temperature higher than the first temperature, a temperature of the first processing gas, and a temperature of the second processing gas into the chamber; and a step of supplying a second volume of the second replacement gas having a temperature lower than the first temperature, the temperature of the first processing gas, and the temperature of the second processing gas into the chamber, and repeating each of the steps.

* * * * *